(12) United States Patent
Schlage et al.

(10) Patent No.: US 11,193,201 B2
(45) Date of Patent: Dec. 7, 2021

(54) APPARATUS FOR DEPOSITING MATERIAL ON THE SURFACE OF A SUBSTRATE

(71) Applicant: Deutsches Elektronen-Synchrotron DESY, Hamburg (DE)

(72) Inventors: Kai Schlage, Schenefeld (DE); Andrey Siemens, Hamburg (DE); Svenja Willing, Seevetal (DE); Christian Adolff, Hamburg (DE); Tatiana Gurieva, Hamburg (DE); Lars Bocklage, Hamburg (DE); Ralf Röhlsberger, Jesteburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 99 days.

(21) Appl. No.: 16/449,594

(22) Filed: Jun. 24, 2019

(65) Prior Publication Data

US 2019/0390327 A1     Dec. 26, 2019

(30) Foreign Application Priority Data

Jun. 25, 2018   (EP) .................................... 18179694

(51) Int. Cl.
*C23C 14/54* (2006.01)
*C23C 14/34* (2006.01)
(Continued)

(52) U.S. Cl.
CPC .............. *C23C 14/54* (2013.01); *C23C 14/34* (2013.01); *C23C 14/505* (2013.01);
(Continued)

(58) Field of Classification Search
None
See application file for complete search history.

(56) References Cited

U.S. PATENT DOCUMENTS

| | | | | |
|---|---|---|---|---|
| 5,288,386 A | * | 2/1994 | Yanagi | H01J 27/08 204/298.06 |
| 6,395,156 B1 | * | 5/2002 | Hsueh | C23C 14/46 204/192.11 |

(Continued)

OTHER PUBLICATIONS

Communication dated Nov. 15, 2018, from the European Patent Office for corresponding European application No. EP18179694.7.

*Primary Examiner* — Jason Berman
(74) *Attorney, Agent, or Firm* — Harness, Dickey & Pierce, P.L.C.

(57) ABSTRACT

An apparatus with a deposition source and a substrate holder having a source mounting portion, which is rotatable about a first axis, a shielding element, which is disposed between the deposition source and the substrate holder, and a drive arrangement. The deposition source has a material outlet opening from which material is emitted. A longitudinal axis of an elongate central region of the material outlet opening extends parallel and centrally between the edges of the material outlet opening. The deposition source is mounted to the source mounting portion such that the longitudinal axis of the central region is parallel to the first axis. The shielding element has an aperture. The drive arrangement controls rotation of the source mounting portion, adjustment of a width of the aperture, and relative movement between the substrate holder and both the source mounting portion and the shielding element.

17 Claims, 6 Drawing Sheets

(51) Int. Cl.
*C23C 14/50* (2006.01)
*H01J 37/34* (2006.01)
*H01F 41/20* (2006.01)

(52) U.S. Cl.
CPC ...... *H01J 37/3417* (2013.01); *H01J 37/3435* (2013.01); *H01J 37/3444* (2013.01); *H01J 37/3447* (2013.01); *H01J 37/3488* (2013.01); *H01F 41/20* (2013.01); *H01J 2237/20214* (2013.01)

(56) References Cited

U.S. PATENT DOCUMENTS

| | | |
|---|---|---|
| 9,437,404 B2 | 9/2016 | Abarra et al. |
| 2010/0155229 A1* | 6/2010 | Endo .................... C23C 14/225 204/192.12 |
| 2012/0247952 A1 | 10/2012 | Endo et al. |
| 2013/0206583 A1* | 8/2013 | Druz .................. H01J 37/3053 204/192.11 |
| 2017/0207071 A1 | 7/2017 | De Bosscher et al. |

* cited by examiner

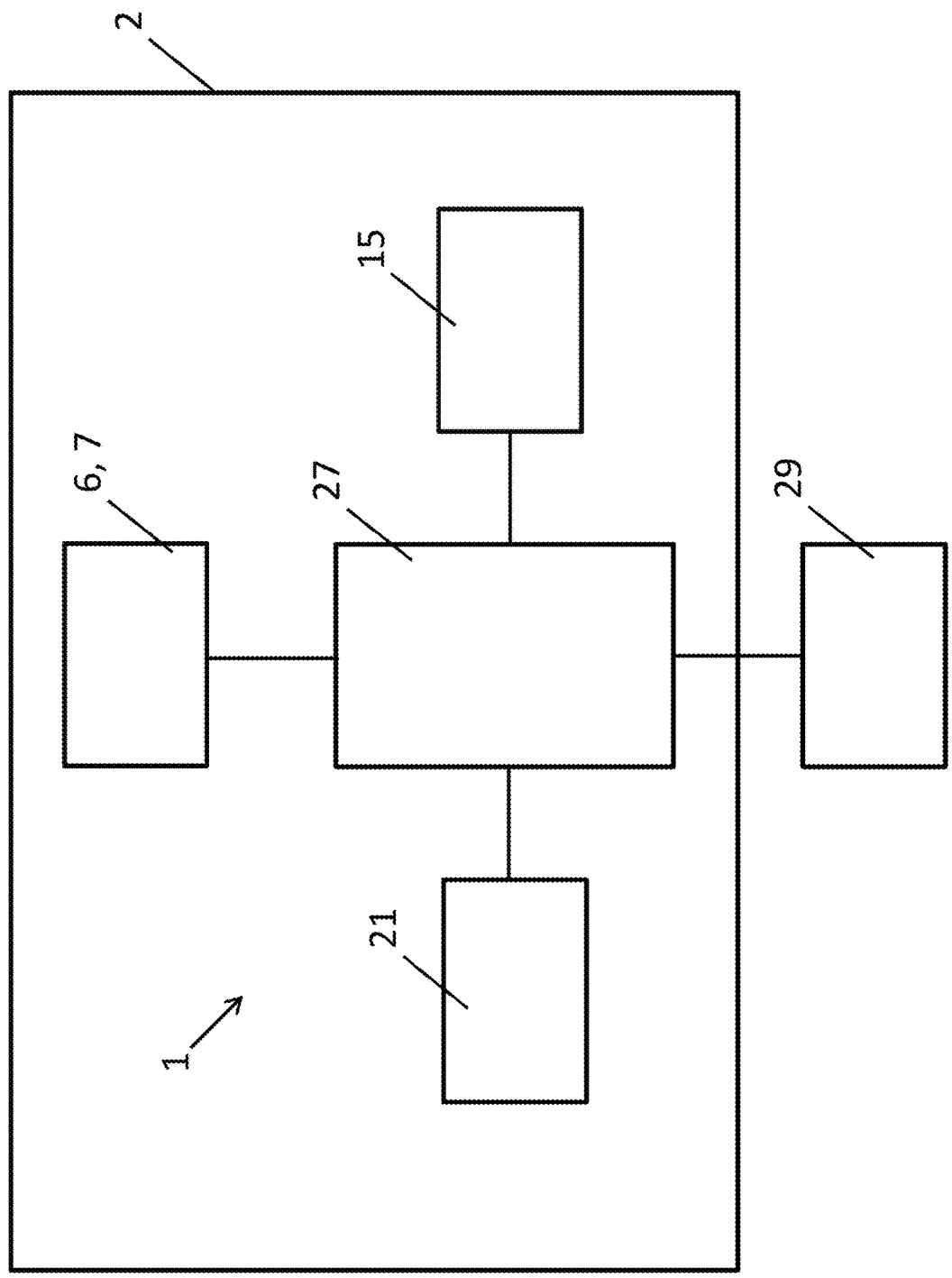

APPARATUS FOR DEPOSITING MATERIAL ON THE SURFACE OF A SUBSTRATE

CROSS-REFERENCE TO RELATED APPLICATIONS

This application claims the benefit and priority of European Patent Application No. EP18179694.7 filed Jun. 25, 2018, the disclosure of which is incorporated by reference as if fully set forth in detail herein.

FIELD

The present disclosure relates to an apparatus for depositing material on the surface of a substrate, comprising at least one deposition source having a material outlet opening and being adapted to emit material from the material outlet opening, and a substrate holder adapted to support a substrate thereon.

BACKGROUND

Deposition of materials on the surface of a substrate finds application in various different fields of technology in order to prepare coated objects or multilayer structures. The properties of coatings and of multilayer structures depend on the characteristics of the coating or of the individual layers of the multilayer structure, and it has been found that one parameter influencing the characteristics of the individual layers being deposited is the angle of incidence of the particles being deposited. Thus, in particular, oblique incidence deposition with a carefully selected angle of incidence can be advantageously utilized in order to assist in or enable adapting the coatings or multilayer structures to the application at issue.

For example, multilayer structures may be utilized as magnetoelectronic devices, which rely on the property of particular multilayer structures, which include ferromagnetic layers separated by intermediate nonmagnetic layers, that their electric resistance changes upon application of an external magnetic field. This so-called magnetoresistance is due to the fact that the electric resistance depends on the relative orientation of the magnetization of the individual ferromagnetic layers, and that an external magnetic field may change this relative orientation. In order to be useful in practice, magnetoresistive multilayer structures must be manufactured with a defined relative orientation of the magnetization of the individual layers, i.e. of their magnetic moments. Therefore, each or at least some of the ferromagnetic layers must be deposited in such a manner that it is magnetically anisotropic, i.e. that it exhibits a particular magnetic moment having a magnitude and a direction. For each individual ferromagnetic layer, which is magnetically anisotropic, the magnetic anisotropy may be created in part or entirely by oblique incidence deposition, i.e. each of the respective ferromagnetic layers is deposited at a respective azimuthal angle and at a respective angle of incidence of the particles being deposited, wherein the azimuthal angle and the angle of incidence are chosen to create the desired uniaxial magnetic anisotropy. While the azimuthal angle of deposition usually determines the orientation of the magnetic moment, i.e. the orientation of the magnetic easy axis, the angle of incidence, which may also be referred to as polar deposition angle, can be used to adjust the strength of the uniaxial magnetic anisotropy of the respective ferromagnetic layer.

However, it has been found that oblique incidence deposition of material onto large area surfaces of substrates is difficult to achieve with high precision and high efficiency, in particular at an industrial scale. For example, it is difficult to achieve homogenous layer thicknesses over the entire area of the surface, and setting the angle of incidence, and the azimuthal angle as well as the distance between the deposition source and substrate flexibly for multiple layers is complicated and takes a long time.

SUMMARY

It is therefore an object of the present invention to provide an apparatus for depositing material on the surface of a substrate, which is of a simple construction and which nevertheless enables precise, fast, cost-efficient, highly flexible and simple production of layers utilizing oblique incidence deposition on large area substrates.

This object is achieved by an apparatus having the features of claim 1 and by a system having the features of claim 17. Preferred embodiments of the apparatus are the subject-matter of the respective dependent claims.

According to the present invention, an apparatus for depositing material on the surface of a substrate comprises one or more deposition sources, such as physical vapor deposition sources. Each of the deposition sources comprises a material outlet opening and is adapted to emit or release material from this material outlet opening. The material outlet opening of each of the deposition sources comprises an elongate or oblong central region which, in turn, comprises two opposite straight parallel spaced edges delimiting the opening on opposite sides. An axis extending parallel to and in the middle between the two opposite edges is a longitudinal axis of the elongate central region of the material outlet opening. The two opposite edges may be referred to as first edges. Thus, the central region constitutes a rectangular portion or section of the overall material outlet opening, the two longer sides of which are defined by the first edges, i.e. the central region is rectangular. Due to this configuration of the material outlet opening, the respective deposition source preferably is or may be adapted such that the distribution of material emitted from the central region is homogenous along any line extending parallel to the longitudinal axis of the central region and to the first edges and disposed in the path of the emitted material. In the sense of the present application, a homogeneous distribution is a distribution in which there is a maximum deviation of 10%, preferably a maximum deviation of 5% and more preferably a maximum deviation of 2% from an average value along the respective line.

The central region is preferably identical to the entire material outlet opening, i.e. preferably there are no other portions of the material outlet opening outside the central region. In this case, the central region is delimited on both sides of the central region in the longitudinal direction of the central region by two opposite straight parallel second edges, which extend perpendicularly with respect to the first edges and the longitudinal axis of the central region. The material outlet opening is then overall elongate and rectangular, wherein the corners between the first and second edges may be angular or rounded. Thus, the material outlet opening of each of the deposition sources has then two opposite longer sides formed by the first edges, and two opposite shorter sides formed by the second edges, and an axis extending parallel to and in the middle between the longer sides is the longitudinal axis of the respective material outlet opening. Thus, the longitudinal axis, which is identical to the longitudinal axis of the central region, intersects the shorter sides in their midpoints and describes the direction into which the longer sides are oriented.

However, it is also possible that the material outlet opening comprises two outer regions disposed on both sides of the central region along the longitudinal axis thereof. These two outer regions, which form integral portions of the single material outlet opening, may have an arbitrary shape, and are preferably adapted not to have an impact on the above-described homogeneity or to have only an impact which is as small as possible.

In any case, the length of the central region along its longitudinal axis is chosen such that is greater than the corresponding dimension of substrates onto which material from the respective deposition source is to be deposited. Preferably, the length of the central region is greater than the corresponding dimension of the substrate holder of the apparatus to be described further below.

The material may, e.g., be stored inside the respective deposition source. It should be noted that the material outlet opening of each of the deposition sources is preferably provided in a housing of the respective deposition source. However, it is also possible that the material outlet opening is provided in a separate element spaced from the housing, in which case the housing itself also has an opening from which the material is emitted towards the separate element. In the latter case, the separate element is preferably mounted in a fixed relative position and orientation with respect to the housing of the deposition source and may, in particular, be fixedly secured to the housing.

The apparatus further comprises a substrate holder, which is adapted to hold a substrate onto which material is to be deposited in operation of the apparatus. The substrate holder may preferably comprise a planar support surface, which is adapted to support the substrate thereon. In use of the apparatus, such planar support surface typically extends horizontally, i.e. the support surface then defines a horizontal plane. If the substrate holder does not comprise a planar support surface, it is preferably adapted or capable to support or hold a substrate having a planar surface such that this planar surface of the substrate extends horizontally in use and defines a horizontal plane. The substrate holder may comprise a substrate fixing means adapted to releasably fix or secure a substrate on the substrate holder, such as on its support surface. Alternatively or additionally, the substrate holder may comprise a heater or heating means and/or a cooling means adapted to selectively heat and cool, respectively, a substrate disposed on the substrate holder.

Moreover, the apparatus comprises a support structure or mounting arrangement. The support structure comprises a source mounting portion or source holder, which is selectively rotatable about a first axis. The one or more deposition sources are mounted or secured to the source mounting portion in such a manner that they rotate about the first axis together with the source mounting portion and that the longitudinal axis of the central region of the material outlet opening of each of the deposition sources is parallel to the first axis. In case the substrate holder comprises a planar support surface as described above, the first axis extends parallel to the support surface of the substrate holder. In any case, the first axis typically extends in a horizontal plane in use. Thus, each of the one or more deposition sources rotates about the first axis if and only if the source mounting portion rotates about the first axis. In this manner, the angle under which material is emitted from the deposition sources and, thus, the angle of incidence of material emitted from the material outlet opening of each of the deposition sources—and, in particular, from the central region of the material outlet opening—onto the surface of a substrate held on the substrate holder can be selectively adjusted in a simple manner. In the usual manner, the angle of incidence is the angle between the path of the particles of material being deposited and a direction perpendicular to the plane of the surface of a substrate held on the substrate holder, or a direction perpendicular to a tangential plane of a particular location of a non-planar or curved surface of a substrate. In case the substrate holder comprises a planar support surface as described above, this direction is the direction perpendicular to the support surface in the case of a planar substrate.

The apparatus also comprises a shielding element, which is disposed between the one or more deposition sources and the substrate holder. The shielding element has an aperture having two opposite sides or borders on opposite sides of a straight line extending parallel to the first axis. Overall, the aperture is generally elongate or oblong, and the straight line is then the longitudinal axis of the aperture, which longitudinal axis extends parallel to the first axis. Preferably the aperture itself is elongate having two opposite longer sides between which the longitudinal axis of the aperture extends, i.e. it is oblong. Such an elongate aperture may preferably be provided in the form of an elongate rectangular aperture having angular or rounded edges, wherein an axis extending parallel to and in the middle between the longer sides is the longitudinal axis of the aperture. Thus, this longitudinal axis of an elongate aperture also extends parallel to the longitudinal axis of central region of the material outlet opening of each of the deposition sources, so that the elongate central regions of the material outlet openings and the elongate aperture have the same orientation. The two opposite sides, i.e. the two longer sides in the case of an elongate aperture, are defined by edges provided by the shielding element. It is to be noted that the aperture may also have two opposite lateral sides, i.e. two opposite shorter sides in the case of an elongate aperture, defined by edges of the shielding element. However, it is also possible that the aperture is not limited or does not have a border at its two lateral ends, or longitudinal ends in the case of an elongate aperture, for example when the aperture is formed by two plates with an edge of each of the two plates defining another one of the two opposite sides of the aperture, i.e. of the two longer sides of the aperture in the case of it being elongate.

This construction with two separate plates, which may also be provided for if the aperture is limited at its two lateral ends, provides for a particularly simple configuration of the shielding element, because the width of the aperture, i.e. the distance between the two opposite sides in a direction perpendicular to the first axis, i.e. between the two longer sides in the case of the aperture being elongate, can be easily adjusted by moving the two plates towards or away from each other.

In any case, the length of the aperture along the direction of the first axis is preferably larger than the corresponding dimension of a substrate onto which material is to be deposited, and preferably larger than the corresponding dimension of the substrate holder.

In any case, the aperture provides a passage for material emitted by the deposition sources to reach the substrate holder, which passage is elongate or oblong in the case of an elongate aperture. Of course, this requires appropriate positioning of the aperture between the one or more deposition sources and the substrate holder. In this regard, in the case of multiple deposition sources it is preferred if only one of these deposition sources at a time is positioned such that material emitted by it can reach the substrate through the aperture. In this regard, it should be noted that it is possible to provide for a second support structure of the same configuration, so that material from two deposition sources, one from each of the support structures, may emit a different material at the same time from different directions and at similar or different angles of incidence, thereby depositing layers from alloys made up of the two different materials. In any case, the shape and the dimensions of the aperture may be fixed or selectively adjustable.

As indicated above, the two opposite sides may preferably extend parallel to each other, thereby providing, in particular, a rectangular aperture. In this case, the distance between the two opposite sides in a direction perpendicular to the first axis—and, in particular, along the second axis defined further below—is constant over the entire extension of the aperture in the direction of the first axis, i.e. over the entire length of the aperture in the case of it being elongate. Due to this configuration the above-described homogenous distribution of material emitted from the material outlet openings of the deposition sources is maintained after passing the aperture. However, the two opposite sides may alternatively also be straight and extend at an angle with respect to each other, thereby providing for example a triangular shape of the aperture, or may be curved. In this case, the distance between the two opposite sides in a direction perpendicular to the first axis—and, in particular, along the second axis defined further below—varies over the extension of the aperture in the direction of the first axis. Due to this configuration the above-described homogenous distribution of material emitted from the material outlet openings of the deposition sources can be selectively changed into an inhomogeneous distribution after passing the aperture. For example, if the aperture is triangular, the distribution linearly increases over the extension of the aperture in the direction of the first axis, because the amount of material passing the aperture at each location along this extension linearly depends on the distance between the two opposite sides in a direction perpendicular to the first axis. Thus, the thickness of the deposited layer may have a linear gradient in a direction parallel to the first axis. Further, due to the fact that, as will be explained below, the substrate holder is rotatable, it is also possible to provide a layer thickness with a two-dimensional gradient or multilayer structures with layer thickness gradients along identical or different lateral or azimuthal orientations for the different layers.

For example, in the above configuration of the shielding element with two plates, which are selectively movable with respect to each other or which are interchangeable with respect to each other, one of the plates may have two opposite edges extending parallel to the first axis, and the other plate may have one edge extending parallel to the first axis and an opposite edge extending at an angle with respect to the first axis or being curved. Then, by interchanging the position of the two plates, it is easily and flexibly possible to change between a rectangular aperture and an aperture having, e.g., a triangular shape.

Furthermore, the apparatus comprises a drive arrangement, which may comprise one or more electric motors and possibly one or more transmission mechanisms. The drive arrangement is adapted to selectively cause a rotation of the source mounting portion about the first axis. The drive arrangement is further adapted to cause selective adjustment of a width of the aperture defined by the distance between the two opposite sides of the aperture. Moreover, the drive arrangement is also adapted to cause a relative movement between the substrate holder on the one hand and the source mounting portion and the shielding element on the other hand along a second axis, which extends perpendicularly to the first axis and, in case the substrate holder comprises a planar support surface as described above, parallel to the support surface. Furthermore, the drive arrangement is preferably also adapted to cause a relative movement between the source mounting portion on the one hand and the substrate holder and the shielding element on the other hand along the second axis and along a third axis. The third axis extends perpendicularly to both the first and second axes and, in case the substrate holder comprises a planar support surface as described above, perpendicularly to the support surface. The relative movement between the substrate holder on the one hand and the source mounting portion and the shielding element on the other hand along the second axis is a movement of the substrate holder with respect to both the source mounting portion and the shielding element. During this relative movement, the source mounting portion and the shielding element preferably do not change their position with respect to each other along the second axis. Generally, the substrate holder may be moved while the source mounting portion and the shielding element are stationary, or the source mounting portion and the shielding element may be moved while the substrate holder is stationary, or all of these components may be moved during the relative movement along the second axis. Similarly, the relative movement between the source mounting portion on the one hand and the substrate holder and the shielding element on the other hand along the second axis and along a third axis is a movement of the source mounting portion with respect to both the substrate holder and the shielding element. During this relative movement, which may be at any time only along the second axis, only along the third axis or simultaneously along the second and third axes, the substrate holder and the shielding element preferably do not change their position with respect to each other along the second axis and the third axis, respectively. Generally, the source mounting portion may be moved while the substrate holder and the shielding element are stationary, or the substrate holder and the shielding element may be moved while the source mounting portion is stationary, or all of these components may be moved during the relative movement along the second axis and/or along the third axis. In any case, this relative movement changes the distance of the source mounting portion to both the shielding element and the substrate holder in a direction parallel to the second axis (i.e., typically the horizontal distance) and the third axis (i.e., typically the vertical distance), respectively.

This apparatus can be realized in a very compact way, so that it can be disposed entirely inside a vacuum chamber, including the drive arrangement. This provides for cost-efficiency. Further, it provides a high flexibility, because using the drive arrangement the angle of incidence can be easily and quickly adjusted precisely in a wide range from 0° to nearly 90° or even from 0° to 90° by causing selective rotation of the source mounting portion about the first axis, the width of the distribution of the angle of incidence can be easily and quickly adjusted precisely by causing adjustment of the width of the aperture, i.e. the distance between the two opposite sides, or longer sides in the case of an elongate aperture, and the distance between the deposition sources and the substrate holder can likewise be easily and quickly adjusted precisely in a wide range by causing the relative movement between the source mounting portion on the one hand and the substrate holder and the shielding element on the other hand along the second and third axes. Thus, the apparatus allows for the production of large area homogeneous films or multilayer structure, e.g. for mirror coatings or sensors, such as magnetoelectronic devices. In this regard, oblique angle incidence can be used to achieve particular magnetic characteristics of the individual layers, and at the same time perpendicular incidence also remains possible. Consequently, it is also easily possible to homogeneously deposit material onto macroscopic 3D objects by suitably varying the angle of the deposition sources during the deposition process. Thus, the apparatus is particularly suitable for the cost-efficient and easy manufacturing at an industrial scale of, e.g., magnetic thin layer systems, such as magnetoelectronic sensors relying on magnetoresistance (for example AMR, GMR or TMR sensors). As explained above, the layers may be easily deposited with a homogeneous layer thickness or with thickness gradients in one or two dimensions.

Further, in case the substrate holder comprises a planar support surface as described above, due to this planar support surface, which can be and typically is oriented horizontally, substrates can be supported horizontally without having to be clamped. Further, due to the use of deposition sources having material outlet openings with an elongate central region as described above—such as, preferably, elongate rectangular material outlet openings—and of an aperture, which may be configured as desired and may be elongate and in particular rectangular, material can be deposited homogeneously or selectively with a desired gradient onto large area substrates under oblique incidence even at very large deposition angles simply by operating the drive arrangement to effect the relative movement between the substrate holder—and, thus, the substrate—on the one hand and the shielding element and the source mounting portion on the other hand along the second axis while material is emitted from one of the deposition sources. In this manner, the entire surface of the substrate gradually moves under the aperture, so that all locations of the surface see the same angles of incidence and traveling distances of particles from the deposition source and receive material for the same amount of time, thereby preventing undesired depositing or layer thickness gradients.

It should be noted that the homogenous distribution of material emitted from the material outlet opening described above in connection with the central region may possibly also be achieved when using other shapes and configurations of the material outlet opening. Therefore, although the above-described shape of the material outlet opening is preferred, for all embodiments of the present invention and, in particular, all embodiments described in the present description, all deposition sources having an arbitrary material outlet opening and adapted to emit material from the material outlet opening having the homogenous distribution described above can be used instead of the deposition sources having the material outlet opening specifically defined above.

In a preferred embodiment, the apparatus further comprises a control unit which is operatively connected to the drive arrangement and which is adapted to control operation of the drive arrangement, in particular to cause the above-described movements and adjustments. Thus, the control unit is preferably adapted to control the drive arrangement to selectively adjust an angle of incidence of material emitted by the one or more deposition sources onto a substrate disposed on the substrate holder by causing the rotation of the source mounting portion about the first axis and causing the relative movement between the source mounting portion on the one hand and the substrate holder and the shielding element on the other hand along the second axis. Alternatively or additionally, the control unit is preferably adapted to adjust a distance between the one or more deposition sources and the substrate holder while maintaining a constant angle of incidence by causing the relative movement between the source mounting portion on the one hand and the substrate holder and the shielding element on the other hand along the second axis and causing the relative movement between the source mounting portion on the one hand and the substrate holder and the shielding element on the other hand along the third axis. Further alternatively or additionally, the control unit is preferably adapted to adjust a width of a distribution of angles of incidence by causing adjustment of the width of the aperture. Further alternatively or additionally, the control unit is preferably adapted to cause the relative movement between the substrate holder on the one hand and the source mounting portion and the shielding element on the other hand along the second axis while material is emitted from the at least one deposition source, thereby causing depositing of a layer of the material on a substrate disposed on the substrate holder. In any case, the control unit simplifies the above-described operation and use of the apparatus. It should be noted that the control unit may be disposed partially or entirely inside a vacuum chamber, together with the remaining components of the apparatus, or it may be disposed outside a vacuum chamber and be connected to the remaining components of the apparatus inside the vacuum chamber by suitably lines.

In a preferred embodiment, the apparatus comprises more than one of the deposition sources. Each of these multiple deposition sources is then preferably adapted to emit a different material, so that different layers of different materials may be deposited by using different ones of the deposition sources at different times during the deposition process. This provides for additional flexibility and cost-efficiency during operation. Further, in this embodiment, when combined with one of the embodiments comprising a control unit, the control unit is also adapted to selectively switch on and off the deposition sources.

In a preferred embodiment, one or more or all of the deposition sources are sputter sources, such as, e.g., DC, RF or pulsed sputter sources. However, each of the deposition sources may also advantageously be selected from the group consisting of these sputter sources, thermal evaporation sources and electron beam evaporation sources. Generally, each of the deposition sources is advantageously a deposition source based on a physical vapor deposition (PVD) method.

In a preferred embodiment, the drive arrangement is further adapted to selectively cause rotation of the substrate holder about the third axis, i.e. about an axis perpendicular to both the first and second axes and, in case the substrate holder comprises a planar support surface as described above, perpendicular to the planar support surface. In this manner, the orientation of the substrate, or more specifically an azimuthal angle with respect to a reference direction extending parallel to the plane spanned by the first and second axes or, in case the substrate holder comprises a planar support surface as described above, parallel to the support surface, can be easily adapted before or during a deposition process. In the usual manner the azimuthal angle is the angle between the projection of the path of the particles being deposited onto the plane of the respective layer being deposited and a reference direction extending in the plane of the respective layer. For multilayer structures, the reference direction is the same for all of the layers, but otherwise can be chosen and determined arbitrarily. Advantageously, the azimuthal angle can be easily and quickly adjusted precisely in a wide range of 0 to 360°. In this embodiment, when combined with embodiments comprising a control unit as described above, it is further preferred if the control unit is adapted to control the drive arrangement to selectively adjust such an azimuthal angle with respect to a reference direction extending parallel to the plane spanned by the first and second axes—and, in case the substrate holder comprises a planar support surface as described above, parallel to the support surface—by causing the rotation of the substrate holder about the third axis. In this regard, it is to be noted that the adjustment of the azimuthal angle may preferably be done between the deposition of different layers. However, it may also be preferable to adjust the azimuthal angle in a step-wise or continuous manner during deposition of a particular layer. With a continuous adjustment it is, for example, possible to produce spiral-shaped nanostructures.

In a preferred embodiment, the shielding element is planar and extends in a plane parallel to the plane spanned by the first and second axes—and, in case the substrate holder comprises a planar support surface as described above, parallel to the support surface.

In a preferred embodiment, the shielding element comprises two plates, wherein each of the opposite sides of the aperture, i.e. the longer sides in case of the aperture being elongate and preferably rectangular, is defined by an edge of another one of the two plates, and wherein the drive arrangement is adapted to move the edges of the two plates towards and away from each other in order to adjust the width of the aperture. In this embodiment, it is further preferred if one of the two plates is selectively removable. Removing one of the plates may still enable producing layers with the desired thickness distributions or gradients if the distance between the deposition sources and the substrate holder is very large.

In a preferred embodiment, the source mounting portion comprises a shaft, which has a longitudinal axis extending along the first axis, and a carriage movable along the shaft by the drive arrangement, or the source mounting portion is a shaft having a longitudinal axis extending along the first axis and movable along the first axis by the drive arrangement. These configurations of the source mounting portion are particularly simple to implement.

In a preferred embodiment, the drive arrangement is further adapted to selectively cause a movement of the source mounting portion along the first axis. This is particularly advantageous in case of multiple deposition sources being mounted to the source mounting portion, because it is easily possible to switch between different of the sources. For this purpose, the multiple deposition sources may, e.g., be arranged in one, two or more rows next to each other along the first axis, so that by moving the source mounting portion along the first axis a different one of the deposition sources can be aligned with the substrate holder along the second axis. Consequently, in this embodiment, when combined with one of the above embodiments comprising a control unit, it is further preferred if the control unit is adapted to control the drive arrangement to selectively align a selected one of the deposition sources with the substrate holder along the second axis.

In a preferred embodiment, the drive arrangement is drivingly coupled to the source mounting portion and to the shielding element, and/or wherein the drive arrangement is drivingly coupled to substrate holder and to the shielding element. For example, the drive arrangement may, in particular, be coupled to the source mounting portion such that it is able to rotate the source mounting portion about the first axis and move it along the third axis—and possibly move it along the second axis and/or, if applicable, move it along the first axis—be coupled to the substrate holder such that the drive arrangement is able to move the substrate holder along the second axis—and, if applicable, rotate it about the third axis, and be coupled to the shielding element such that the drive arrangement is able to adjust the width of the aperture and to move the shielding element along the second axis.

The apparatus according to any of the above-described embodiments may advantageously be part of a system for depositing material on the surface of a substrate, which system also comprises a vacuum chamber. The one or more deposition sources, the substrate holder, the shielding element and the support structure are disposed inside the vacuum chamber. The same preferably applies to the drive arrangement in its entirety or to portions or parts of the drive arrangement. For example, if the drive arrangement comprises stepper motors, one or more or all of the stepper motors may be arranged outside the vacuum chamber and may transmit translatory or rotary driving force through a respective vacuum feedthrough. As already noted above, in embodiments comprising a control unit, the control unit may preferably be disposed inside the vacuum chamber, but may also be disposed entirely or partially outside the vacuum chamber. In this manner, deposition sources for different materials and of different sizes can be flexibly utilized without having to open the vacuum chamber, which is time-consuming and costly.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 is a schematic block diagram of a system of the invention;

Corresponding reference numerals indicate corresponding parts throughout the several views of the drawings.

DETAILED DESCRIPTION

Figure 1A:
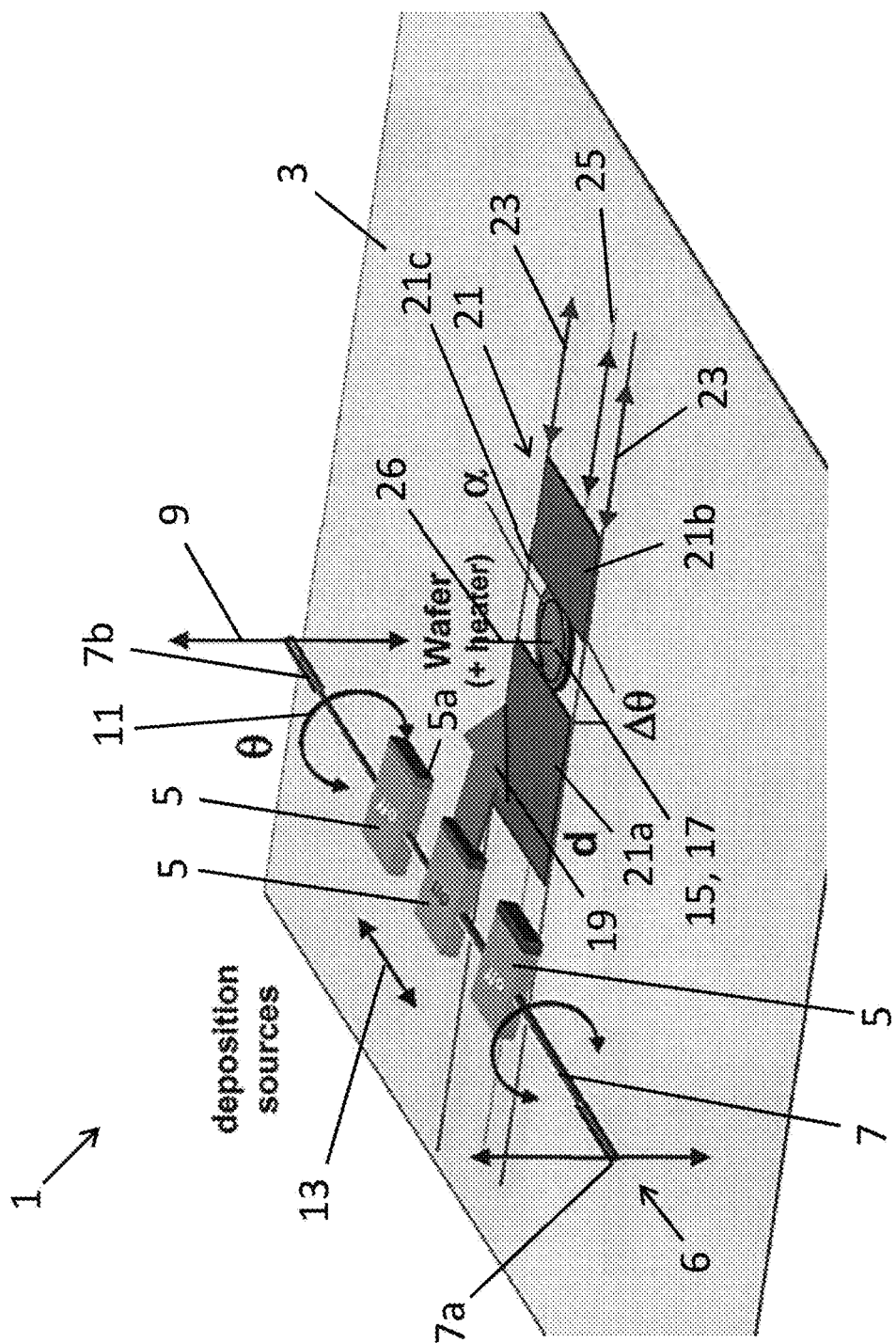
FIG. 1A is a schematic perspective view of an apparatus according to the invention, wherein the drive arrangement has been left away.

In FIG. 1A an embodiment of an apparatus 1 for depositing material onto a substrate is shown in a schematic perspective view, and FIG. 2 shows a schematic block diagram of a system, which comprises the apparatus 1 of FIG. 1A and a vacuum chamber 2. The apparatus 1 comprises a base plate 3, to which a support structure 6, a substrate holder 15, and a shielding element 21 are mounted. It should be noted that instead of the base plate 3 it is also possible to provide separate support elements or support points for suitably supported the various components of the apparatus 1. The support structure 6, the substrate holder 15, and the shielding element 21 are disposed together with a drive arrangement 27, which may comprise one or more electric motors, inside the vacuum chamber 2. A control unit 29, which in the illustrated embodiment is disposed outside the vacuum chamber 2, is connected to the drive arrangement 27 such that it is able to control the operation of the drive arrangement 27 in the manner described below.

Figure 1B:
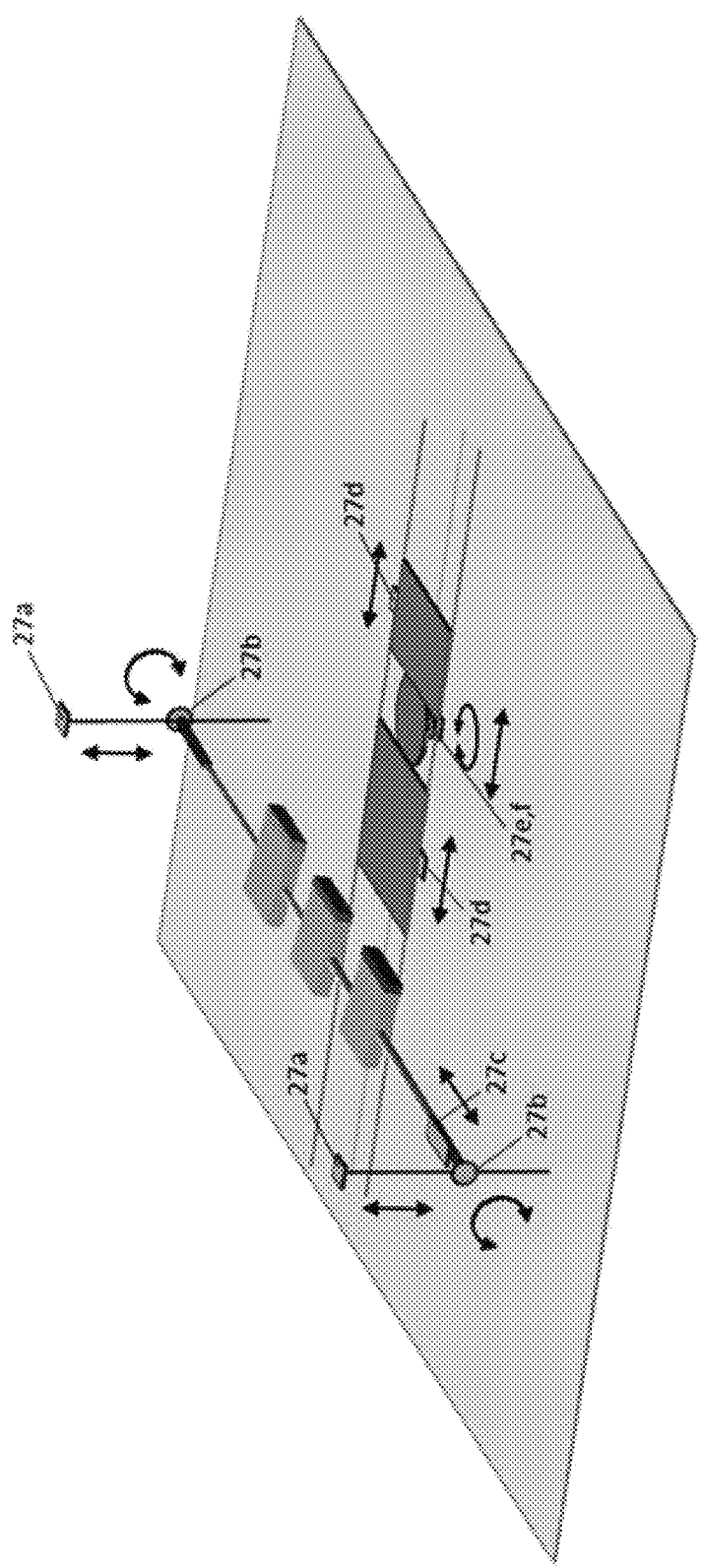
FIG. 1B is a further schematic perspective view of the apparatus of FIG. 1A corresponding to the view of FIG. 1A, but showing more details of an embodiment of a drive arrangement of the apparatus.

As can be seen in FIG. 1A, the apparatus 1 comprises multiple deposition sources 5, for example three, which are mounted to a shaft 7, which is part of the support structure 6 and constitutes a source mounting portion of the support structure 6. The shaft 7 is rotatably mounted by two bearings 7a, 7b at opposite ends of the shaft 7, such that it is rotatable about a first axis defined by the longitudinal extension of the shaft 7 (see the arrow 11). Thus, the deposition sources 5 rotate about the first axis upon rotation of the shaft 7, which can be selectively caused by the drive arrangement 27 under the control of the control unit 29. For this purpose, the drive arrangement 27 is drivingly coupled to the shaft 7. For example, the drive arrangement 27 may comprise an electric motor having a rotary output shaft, which is coupled directly or via a suitable transmission to the shaft 7. The shaft 7 is also mounted such that it is selectively movable by the drive arrangement 27 and under the control of the control unit 29 linearly in the vertical direction 9, thereby selectively increasing and decreasing the vertical height of the deposition sources 5 above the base plate 3 and the substrate holder 15. For this purpose, the drive arrangement 27 may comprise another electric motor coupled via a suitable transmission to the shaft 7. The shaft 7 is also mounted such that it is selectively movable by the drive arrangement 27 and under the control of the control unit 29 linearly along the first axis (see the arrow 13), thereby selectively aligning a different one of the deposition sources 5 with the substrate holder 15. For this purpose, the drive arrangement 27 may comprise yet another electric motor coupled via a suitable transmission to the shaft 7. For example, as schematically illustrated in FIG. 1b, the drive arrangement 27 may comprise a plurality of stepper motors 27a to 27f, wherein two stepper motors 27a are drivingly coupled to the shaft 7 and adapted and arranged to linearly move the shaft 7 in the vertical direction 9, two stepper motors 27b are drivingly coupled to the shaft 7 and adapted and arranged to rotate the shaft 7 about the first axis along the arrow 11, a stepper motor 27c is drivingly coupled to the shaft 7, or a carriage movably mounted on the shaft 7, adapted and arranged to move the shaft 7 and the carriage, respectively, along the first axis along the arrow 13, two stepper motors 27d are each adapted and arranged to move another one of the plates 21A, 21b described below along the second axis 25 likewise described below and are drivingly coupled to these plates 21A, 21b, and two stepper motors 27e and 27f are drivingly coupled to the substrate holder 15 and adapted and arranged to linearly move the substrate holder 15 along the second axis 25 and rotate the substrate holder 15 about the vertical direction, respectively.

Each of the deposition sources 5 comprises an elongate or oblong rectangular material outlet opening 5a, the longer sides of which are oriented parallel to the first axis, i.e. parallel to the shaft 7. The material outlet opening 5a can also be described as having a central region identical to the material outlet opening 5a itself without further regions to both sides of the central region 5a. However, it may also be possible to provide for such further regions. The angle θ under which material or particles 19 are emitted from the deposition sources 5—and thus the angle of incidence of the material or particles onto a substrate disposed on the substrate holder—can be precisely adjusted by selectively rotating the shaft 7 by means of the drive arrangement 27 and the control unit 29.

In the illustrated embodiment the substrate holder 15 comprises an upper planar and horizontally extending support surface 17, on which a substrate can be disposed. The substrate holder 15 is mounted such that it is selectively movable by the drive arrangement 27 and under the control of the control unit 29 linearly along a second axis 25, which extends horizontally and perpendicular to the first axis or shaft 7, and such that it is selectively rotatable by the drive arrangement 27 and under the control of the control unit 29 about a third axis 26, which extends in the vertical direction and perpendicularly to the support surface 17 of the substrate holder 15. For this purpose, the drive arrangement 27 may comprise yet another two electric motors, which are coupled directly or via suitable transmissions to the substrate holder 15. Rotation of the substrate holder 15 about the third axis 26 adjusts the azimuthal angle α under which material is deposited onto a substrate disposed on the support surface 17, and movement of the substrate holder 15 along the second axis 25 changes the horizontal distance between the deposition sources 5 and the substrate holder 15.

The shielding element 21 comprises two rectangular plates 21A, 21b, which extend in a horizontal plane and are spaced from each other such that they define between them a rectangular, elongate or oblong aperture 21c, the longer sides of which are oriented parallel to the first axis or shaft 7. Thus, with respect to the second axis, the elongate rectangular aperture 21c is oriented in the same way as the elongate rectangular material outlet openings 5a of the deposition sources 5. Both plates 21A, 21b are mounted such that each of them is selectively movable individually by the drive arrangement 27 and under the control of the control unit 29 linearly along a second axis 25. For this purpose, the drive arrangement 27 may comprise yet another two electric motors, which are coupled directly or via suitable transmissions to the plates 21A, 21b. The control unit 29 is operable to selectively control the drive arrangement 27 to move both plates 21A, 21b simultaneously and synchronously to change the horizontal position of the aperture 21c along the second axis 25 (see arrows 23), while maintaining the width of the aperture 21c constant, and to move only one of the plates 21A, 21b or to move both plates 21A, 21b with respect to each other in order to change the width of the aperture 21c.

For depositing multiple layers of material having homogeneous thicknesses onto a large area substrate and different magnetic properties caused by deposition under different oblique angles of incidence, the substrate is disposed on the support surface 17 of the substrate holder. Then, for each layer to be deposited, the desired angle of incidence, the desired width of the incidence angle distribution, the desired azimuthal angle, the desired deposition source 5, and the desired distance between the desired deposition source 5 and the substrate are set by the control unit 29 by controlling the drive arrangement 27.

Specifically, in order to set the desired angle of incidence, the shaft 7 is rotated to the appropriate angle θ, and the shielding element 21 is moved along the second axis 25 such that the aperture 21c is positioned in the path of the material emitted by the deposition source 5 aligned with the substrate holder 15. The width of the incidence angle distribution is set by moving the plates 21A, 21b of the shielding element 21 with respect to each other along the second axis 25, such that the width of the aperture 21c along the second axis 25 is adjusted to the desired value. The appropriate deposition source 5 is selected by moving the shaft 7 along the first axis to align the desired deposition source 5 with the substrate holder 15 (in FIG. 1A the deposition source 5 in the middle of the row of three deposition sources 5). The azimuthal angle is set by rotating the substrate holder 15 about the third axis 26. Further, the distance between the desired deposition source 5 and the substrate is set by moving the shaft 7 and the deposition sources 5 vertically (arrows 9) and by moving the shielding element 21 horizontally (arrows 23). During deposition, the selected deposition source 5 is switched on by the control unit 29, while the other deposition sources 5 remain switched off, and the substrate holder 15 with the substrate are then moved horizontally along the first axis 25, so that the entire surface of the substrate moves gradually under the aperture 21c, so that all locations on the surface receive material from the selected deposition source 5 under the same conditions.

Figure 3:
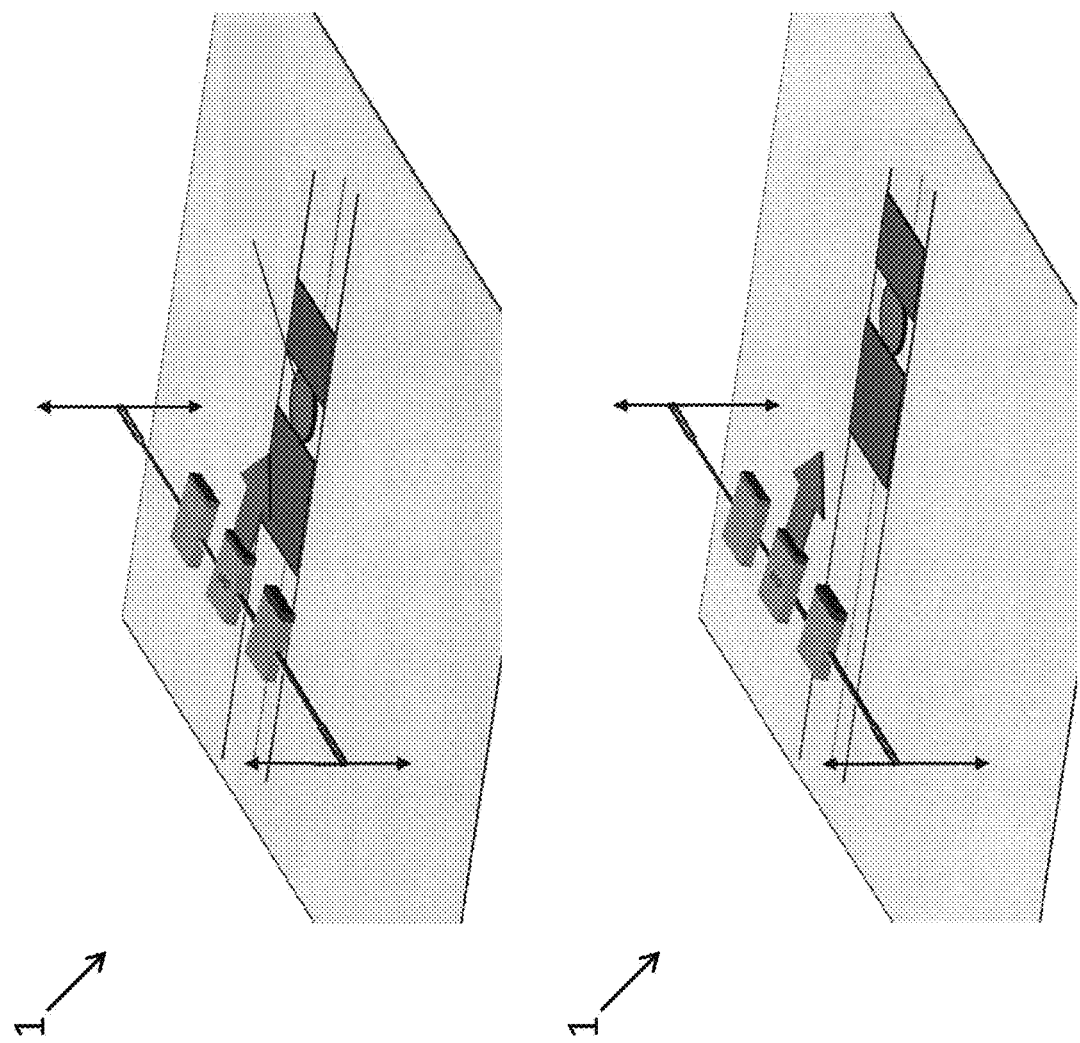
FIG. 3 shows schematic perspective views of the apparatus of FIG. 1A illustrating a change of the distance between the deposition sources and the substrate holder while maintaining the angle of incidence constant.
Figure 4:
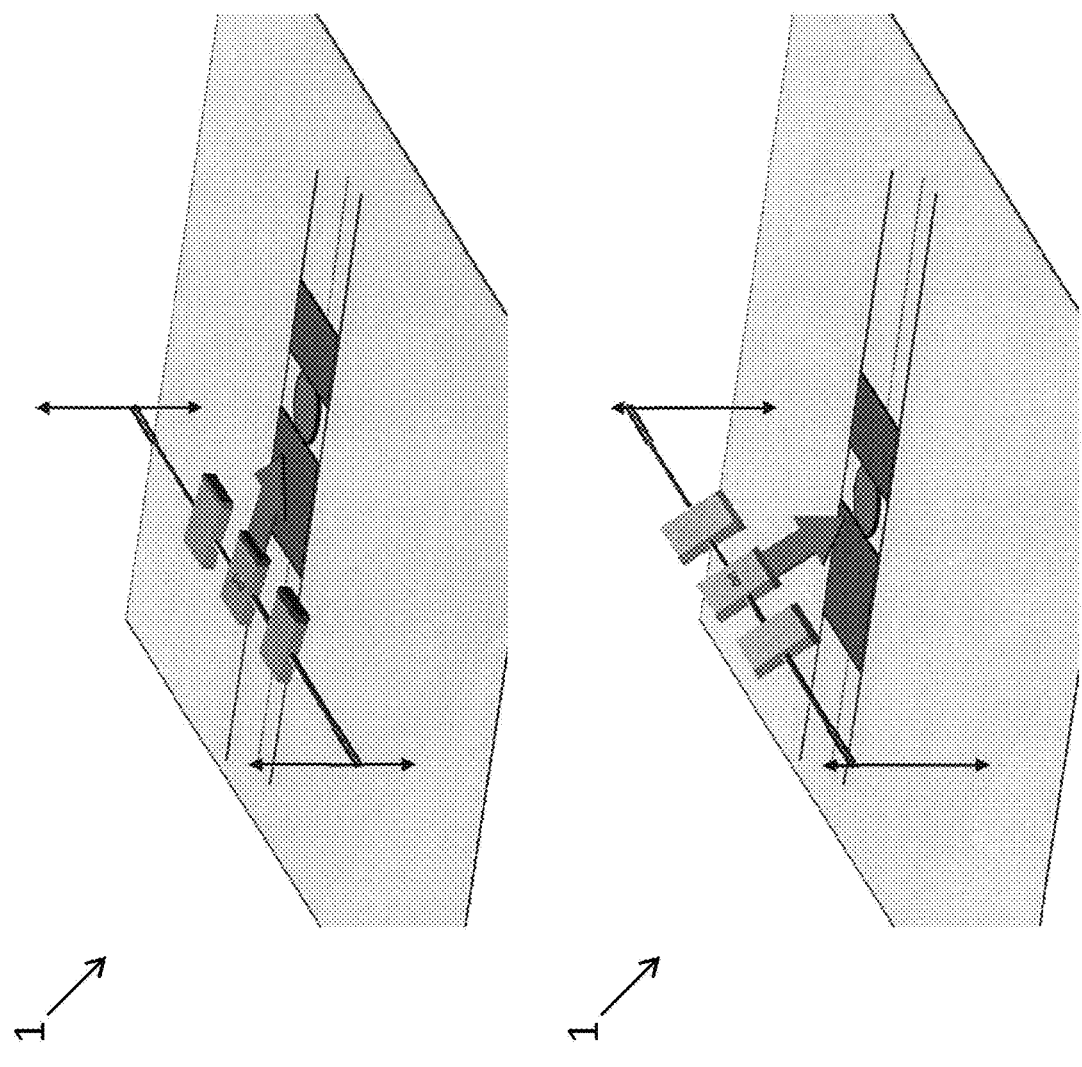
FIG. 4 shows schematic perspective views of the apparatus of FIG. 1A illustrating a change of the angle of incidence.
Figure 5:
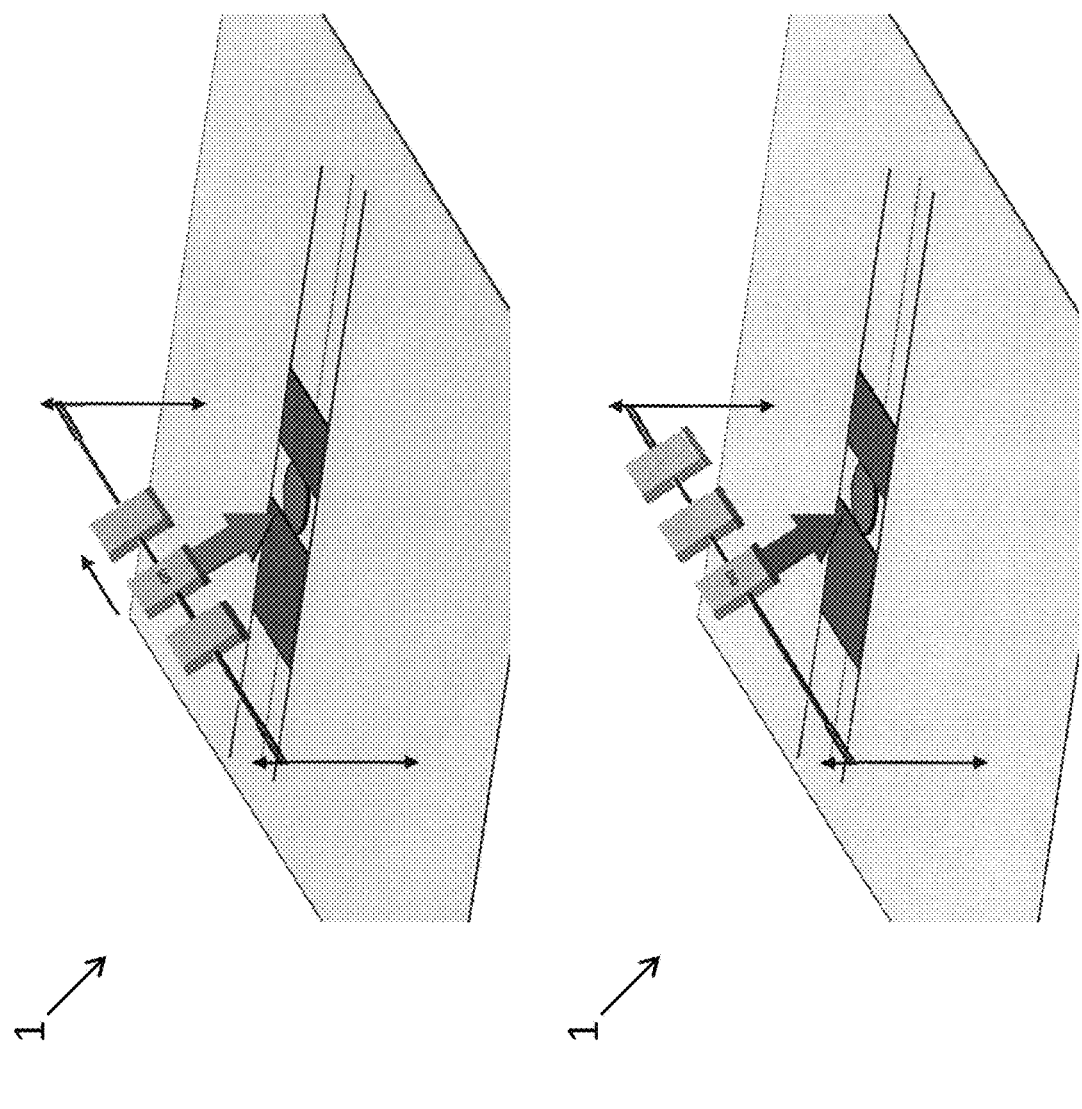
FIG. 5 shows schematic perspective views of the apparatus of FIG. 1A illustrating a change of the deposition source.

To further illustrate the above-described operation of the apparatus 1, FIG. 3 schematically shows a change of the distance between the selected deposition source and the substrate holder 15 while maintaining the angle of incidence constant. As can be seen, this is carried out by moving the shaft 7 and the deposition sources 5 vertically and by moving the shielding element 21 and the substrate holder 15 horizontally along the second axis 25. FIG. 4 schematically shows a change of the angle of incidence while maintaining the distance between the selected deposition source 5 and the substrate holder 15 constant. As can be seen, this is carried out by rotating the shaft 7 and moving it in the vertical direction and by moving the shielding element 21 and the substrate holder 15 horizontally along the second axis 25. FIG. 5 schematically shows a change of the selected deposition source 5. As can be seen, this is carried out by moving the shaft 7 along the first axis to align another one of the deposition sources 5 with the substrate holder.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An apparatus for depositing material on the surface of a substrate, the apparatus comprising:
    at least one deposition source comprising a material outlet opening and being adapted to emit material from the material outlet opening, wherein the material outlet opening has an elongate central region comprising two opposite straight parallel spaced edges delimiting the material outlet opening on opposite sides, wherein an axis extending parallel to and in the middle between the two opposite edges is a longitudinal axis of the central region of the material outlet opening;
    a substrate holder adapted to support a substrate thereon;
    a support structure comprising a source mounting portion, which is selectively rotatable about a first axis and to which the at least one deposition source is mounted such that it rotates about the first axis together with the source mounting portion and such that the longitudinal axis of the central region of the material outlet opening of the at least one deposition source is parallel to the first axis;
    a shielding element disposed between the at least one deposition source and the substrate holder and having an aperture, which has two opposite sides on opposite sides of a straight line extending parallel to the first axis, and
    a drive arrangement adapted to selectively cause
        a rotation of the source mounting portion about the first axis,
        selective adjustment of a width of the aperture defined by the distance between the two opposite sides of the aperture perpendicular to the first axis, and
        a relative movement between the substrate holder on the one hand and the source mounting portion and the shielding element on the other hand along a second axis, which extends perpendicularly to the first axis,
    wherein the drive arrangement is further configured to selectively cause a relative movement between the source mounting portion on the one hand and the substrate holder and the shielding element on the other hand along the second axis and along a third axis, which extends perpendicularly to the first axis and to the second axis.

2. The apparatus of claim 1, further comprising a control unit operatively connected to the drive arrangement and adapted to control operation of the drive arrangement.

3. The apparatus of claim 2, wherein the control unit is configured to control the drive arrangement to selectively
    adjust an angle of incidence of material emitted by the at least one deposition source onto a substrate disposed on the substrate holder by causing the rotation of the source mounting portion about the first axis and causing the relative movement between the source mounting portion on the one hand and the substrate holder and the shielding element on the other hand along the second axis,
    adjust a distance between the at least one deposition source and the substrate holder while maintaining a constant angle of incidence by causing the relative movement between the source mounting portion on the one hand and the substrate holder and the shielding element on the other hand along the second axis and causing the relative movement between the source mounting portion on the one hand and the substrate holder and the shielding element on the other hand along the third axis,
    adjust a width of a distribution of angles of incidence by causing adjustment of the width of the aperture perpendicular to the first axis, and/or
    cause the relative movement between the substrate holder on the one hand and the source mounting portion and the shielding element on the other hand along the second axis while material is emitted from the at least one deposition source.

4. The apparatus of claim 1, wherein the at least one deposition source comprises multiple deposition sources adapted to emit different materials.

5. The apparatus of claim 1, wherein at least one of the at least one deposition source is a sputter source.

6. The apparatus of claim 1, wherein the drive arrangement is further configured to selectively cause rotation of the substrate holder about the third axis.

7. The apparatus of claim 6, further comprising a control unit operatively connected to the drive arrangement and adapted to control operation of the drive arrangement.

8. The apparatus of claim 7, wherein the control unit is configured to control the drive arrangement to selectively adjust an azimuthal angle with respect to a reference direction extending in a plane parallel to by causing the rotation of the substrate holder about the third axis.

9. The apparatus of claim 1, wherein the shielding element comprises two plates, wherein each of the opposite sides of the aperture is defined by an edge of another one of the two plates, and wherein the drive arrangement is adapted to move the edges of the two plates towards and away from each other in order to adjust the width of the aperture perpendicular to the first axis.

10. The apparatus according to claim 9, wherein one of the two plates is selectively removable.

11. The apparatus of claim 1, wherein the source mounting portion comprises a shaft, which has a longitudinal axis extending along the first axis, and a carriage movable along the shaft by the drive arrangement, or is a shaft having a longitudinal axis extending along the first axis and movable along the first axis by the drive arrangement.

12. The apparatus of claim 1, wherein the drive arrangement is further adapted to selectively cause a movement of the source mounting portion along the first axis.

13. The apparatus of claim 12, further comprising a control unit operatively connected to the drive arrangement and adapted to control operation of the drive arrangement.

14. The apparatus of claim 13, wherein the at least one deposition source comprises multiple deposition sources adapted to emit different materials.

15. The apparatus of claim 14, wherein the control unit is adapted to control the drive arrangement to selectively align a selected one of the deposition sources with the substrate holder along the second axis.

16. The apparatus of claim 1, wherein the drive arrangement is drivingly coupled to the source mounting portion and to the shielding element, and/or wherein the drive arrangement is drivingly coupled to substrate holder and to the shielding element.

17. A system for depositing material on the surface of a substrate, comprising a vacuum chamber and an apparatus according to claim 1, wherein the at least one deposition source, the substrate holder, the shielding element, the support structure and the drive arrangement are disposed inside the vacuum chamber.

* * * * *